(12) United States Patent
Davis

(10) Patent No.: US 6,784,470 B2
(45) Date of Patent: Aug. 31, 2004

(54) BUFFER, BUFFER OPERATION AND METHOD OF MANUFACTURE

(75) Inventor: Jeffrey B. Davis, El Dorado, CA (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 10/383,442

(22) Filed: Mar. 6, 2003

(65) Prior Publication Data

US 2003/0227034 A1 Dec. 11, 2003

Related U.S. Application Data

(62) Division of application No. 10/163,786, filed on Jun. 5, 2002.

(51) Int. Cl.[7] .............................................. H01L 29/72
(52) U.S. Cl. ..................... 257/256; 257/258; 257/259; 257/263
(58) Field of Search ................................ 257/256, 258, 257/259, 263

(56) References Cited

U.S. PATENT DOCUMENTS

2001/0003368 A1   6/2001   Shim et al.
2003/0151101 A1 * 8/2003   Rumennik et al. ............ 257/76

* cited by examiner

Primary Examiner—Edward Wojciechowicz
(74) Attorney, Agent, or Firm—Marger Johnson & McCollom, P.C.

(57) ABSTRACT

An integrated circuit includes an output buffer operable to drive an output node. The output buffer may comprise a MOSFET having a JFET integrated within a portion of a drain region of the MOSFET. The JFET may comprise a gate of second conductivity formed in semiconductor material of first conductivity type, which is contiguous with the drain region for the MOSFET. A voltage shaping circuit may control a bias of the JFET gate in accordance with the voltage levels of an output node and a predetermined output impedance.

6 Claims, 4 Drawing Sheets

US 6,784,470 B2

BUFFER, BUFFER OPERATION AND METHOD OF MANUFACTURE

This application is a divisional of prior application Ser. No. 10/163,786 filed Jun. 5, 2002.

BACKGROUND

Input-output buffers may be used to send or receive signals to or from a communication line. For example, in a data processing system, a processor may send signals over a bus by way of a buffer. As system operating speeds increase, the impedance presented by the buffer may affect the integrity of communications on the bus.

Additionally, signals of a bus within a data processing system may comprise voltage levels different from those within (e.g., within the core of) an integrated circuit. For example, in some applications, a bus may be transferring signals between devices, e.g., a processor and memory, that are unrelated to a secondary integrated circuit, e.g., of a printer interface, that may be coupled thereto. In such application, a buffer of the secondary integrated circuit might be disabled or tri-stated while not actively communicating over the bus. However, if signal levels on the bus may exceed voltages of the integrated circuit, its isolation from the bus may be affected.

To adjust an output impedance of a buffer, a resistive legging/ladder structure might be formed in series with a driver transistor coupled to the output node. Based upon a determined resistance or I-V characteristic of the drive transistor, the resistive legging structure may be structured to contribute a predetermined compensation resistance. Accordingly, the drive transistor may present, in combination with the structured resistive legging circuit, an impedance suitable for interfacing the bus.

More recently, manufacturers have been seeking additional measures to enhance system operating speeds while preserving bus integrities and maintaining the reliability of integrated circuits.

BRIEF DESCRIPTION OF THE DRAWINGS

The present disclosure may be best understood with reference to the accompanying drawings, wherein.

DETAILED DESCRIPTION

Figure 1:
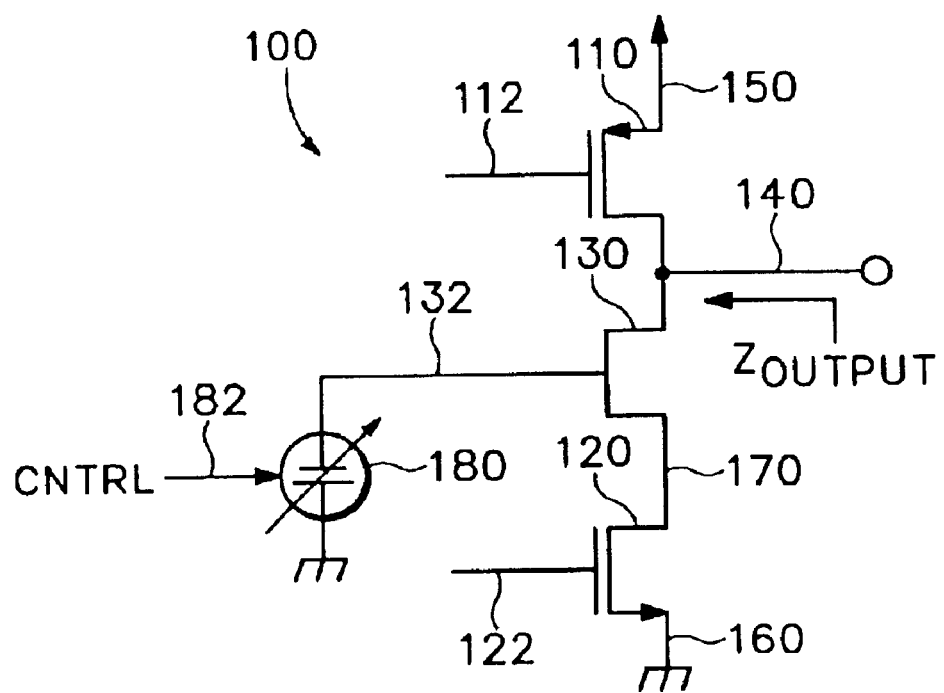
FIG. 1 is a schematic diagram of a portion of a driver circuit.

In the following description, numerous specific details are set forth to provide an understanding of exemplary embodiments of the present invention. It will be understood, however, that alternative embodiments may comprise subcombinations of the disclosed exemplary embodiments.

Additionally, readily established circuits may be disclosed in simplified form (e.g., block diagram style) to avoid obscuring the essence of the embodiments with excess detail. Likewise, to aid a clear and precise disclosure, the description of their operations—e.g., timing considerations and the like—may similarly be simplified when persons of ordinary skill in the art can readily understand their operations by way of the drawings and disclosure.

The terms wafer and substrate may be used in the following description to reference a structure having an exposed surface with which to form an integrated circuit (IC) structure. The term substrate is understood to include semiconductor wafers. The term substrate may also be used to refer to semiconductor structures during processing, and may include other layers that have been fabricated thereupon. Both wafer and substrate may include doped and undoped semiconductors, epitaxial semiconductor layers supported by a base semiconductor or insulator, as well as other semiconductor structures as known to one skilled in the art.

An insulator may be used to reference material that is less electrically conductive than materials referred to as conductors.

When referencing an integration of circuitry, it may be described as being formed together, on or within the substrate and may be referenced as an "integrated circuit."

In the drawings, elements are not necessarily drawn to scale. Additionally, like or similar elements are typically designated by the same number through the separate views.

Referencing FIG. 1, exemplary buffer 100 for an integrated circuit includes complimentary output driver transistors 110 and 120 for driving output node 140. Pull-up transistor 110 may comprises a P-channel MOSFET (or simply P-MOSFET). Pull-down transistor 120 may comprise an N-channel MOSFET (or simply N-MOSFET). When charging the output node to a high level, the N-MOSFET 120 may be disabled and the P-MOSFET 110 enabled. Accordingly, the output node 140 receives a bias from supply node 150.

Supply 150 may be referenced as an upper supply or simply a supply bias separate from that of bias source 160. In the illustrated example of FIG. 1, bias 160 is shown as ground. However, it will be understood that the scope of the present invention may encompass alternative power supplies.

Figure 2:
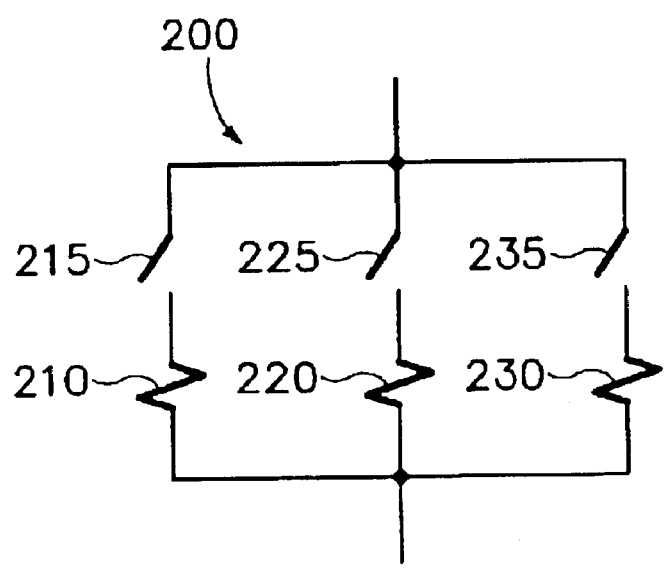
FIG. 2 is schematic diagram showing an example of a resistor legging circuit.

To drive the output node low, the pull-up transistor is disabled and the pull-down transistor (e.g., N-MOSFET device in this embodiment) is enabled. The output node discharges to the bias level of the lower supply 160—e.g., ground in this embodiment. When the output is being driven low, the impedance $Z_{output}$ of buffer 100, which is presented to output node 140, may correspond primarily to the drain-to-source impedance Rds of N-MOSFET 120. To establish a desired output impedance for the buffer, previous solutions may have used a resistive legging circuit, e.g., such as that which is shown in FIG. 2. Such resistive legging circuit would be disposed serially between the pull-down transistor and the output terminal.

For example, select switch 215 might be configured (e.g., wire bonds, fuse links, thin film interconnects) to include resistor 210; or, alternatively, the other select switches 225, 235 might also be closed to include other resistors 220, 230 within an overall compensation resistance.

To determine the resistor selections, first, a measurement may be made of the I-V characteristics for the N-MOSFET. Next, the switches may then be programmed dependent on the determined I-V characteristic of the pull-down transistor to establish a desired output impedance. But, such resistor legging circuit may consume semiconductor real estate and require cumbersome procedures to configure the switches, wire bonds, etc. for establishing the desired resistor configuration.

In accordance with an exemplary embodiment of the present invention, with reference to FIG. 1, a JFET 130 may be integrated with a drain of the pull-down transistor 120. JFET 130 may require less space over a semiconductor substrate than that which might otherwise be required by the previously described resistor legging circuits. The JFET may also be more readily programmed.

During operation, the JFET may have a variation in its I-V characteristics as the output voltage changes. Yet, the JFET's variations may be complimentary to the variations of the pull-down MOSFET. Accordingly, the two devices may have complimentary characteristics that may counteract one another so as to establish a more consistent and linear output impedance when the voltage changes at the output node 140.

Further referencing to FIG. 1, buffer 100 of an exemplary embodiment comprises JFET 130 in series with the output of N-MOSFET 120. The JFET may permit the drain-to-source impedance Rds of the N-MOSFET to be adjusted dependent on the control bias applied to the gate 132 of the JFET. In this fashion, JFET might be descried as a voltage controlled resistor operable to control the impedance of the pull-down transistor. The granularity in step size for the output impedance may be determined by the granularity in voltage level available to programmable voltage source 180.

Control input 182 receives a control signal (e.g., digital, analog) that may be derived from a programmable device (not shown)—e.g., flash, memory, fuse, wire bonds, configuration register etc. Such programmable device may be programmed during a calibration procedure, a power-up procedure or set-up protocol either in the field or during manufacturing. The programmed setting shall establish a bias to gate 132 of the JFET for establishing a resistance therefore.

The gate bias of JFET 130 should be set to establish a resistance value less than hundreds of ohms. In this embodiment, the bias may be set to establish a linearizing resistance between 25 to 50 ohms. A modulation range of a programmable source might be provided to establish a modulation range of 50 to 100 percent of the established center resistance value. In a particular embodiment, the variable voltage source may comprise, for example, a DC source such as a band gap generator, digital-to-analog converter or other such programmable reference source.

Figure 3:
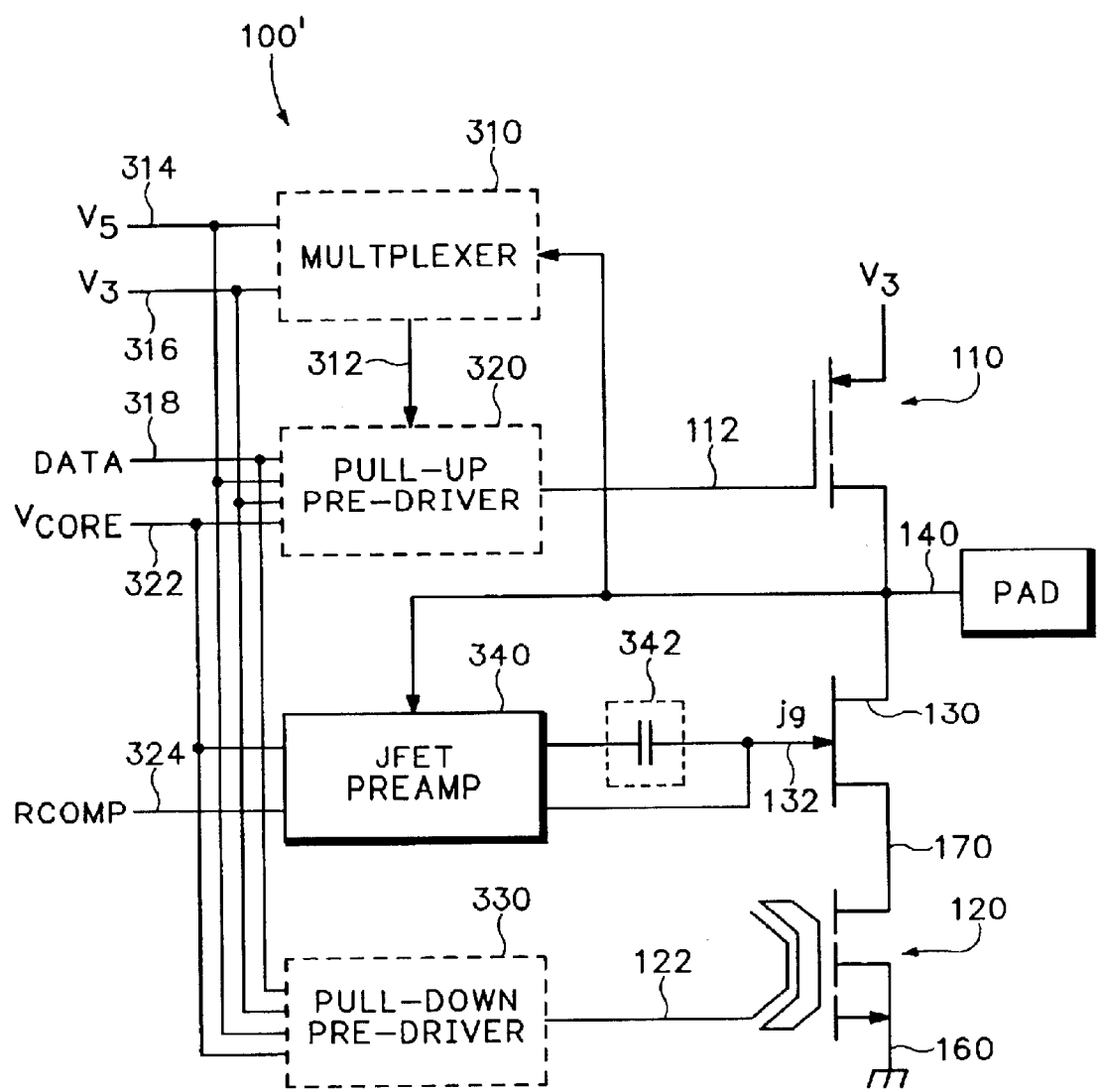
FIG. 3 is a schematic diagram of another buffer circuit, which includes a shaping circuit to generate a bias for the gate of a JFET.

Referencing FIG. 3, the bias to the gate 132 of JFET 130 may be generated by a JFET pre-amplifier shaper 340. Shaper 340 may receive input signals and generate a gate bias for JFET 130 to adjust its resistance and preserve a substantially constant output impedance of buffer 100' to output node 140. In other words, shaper 340 may adjust the gate bias dependent on a variety of inputs, such as, e.g., an internal voltage 322 of the integrated circuit (Vcore), a control signal that may designate the desired output impedance (Rcomp) and an output voltage of node 140.

The control signal (e.g., Rcomp) may be derived from a control register of the integrated circuit. The control register may designate a desired impedance level that the JFET is to establish for the pull-down MOSFET. A value of Rcomp may be previously established by calibration procedures that determine the I-V characteristics of the MOSFET. For example, during testing of the integrated circuit (e.g., at wafer level or packaged and in production or in the field, etc.), the impedance characteristics of the N-MOSFET may be determined and used to program the desired value for Rcomp.

The impedances of the JFET and MOSFET may be influenced by the internal operating voltage (e.g., Vcore) within the integrated circuit and also by the voltage level at the output terminal. But by monitoring these levels, shaper 340 may adjust (i.e., shape) the gate bias for JFET 130 as pre-determined to maintain an output impedance of the buffer over variations of the environmental influences—e.g., Vcore and Vout.

In another embodiment, an AC signal may be used to drive the gate 132 of JFET 130 to control its series resistance. For example, the signal of the output node may be fed back to affect the JFET's gate bias as previously determined to be appropriate to preserve the buffer's output impedance. In accordance with a further embodiment, a combined DC bias and an overlaid AC signal might also be used to drive the gate of JFET 130. In such embodiment, transients of the output node 140 may be used to affect the gate drive of JFET 130 while an underlying DC bias may establish its center or nominal operating region.

In a further alternative embodiment, capacitor 342 may be disposed in series with the JFET gate. The JFET preamplifier 340 may pump the bias level of gate 132 via the capacitor. This alternative embodiment may be effective to assure power conservation should the buffer, or integrated circuit of the buffer, be placed in a sleep or suspended activity mode. During a sleep mode, it may be desirable to minimize power dissipation. A capacitor in series with the JFET gate may assure that current is not being sourced or sunk into the JFET during the sleep mode. When in normal use, the gate of the JFET may be pumped to a desired bias level via the series capacitor, and, likewise, the capacitor and gate configuration may be described to be operable as a floating gate (e.g., similarly to a floating gate of a flash memory device).

Further referencing FIG. 3, pre-drivers 320,330 receive a data signal from input 318 and drive the gates 112,122 of the complimentary pull-up and pull-down MOSFETs 110,120 dependent on the data input signal. The pre-drivers establish the necessary level shifts to drive the gates based on the data input signal. For example, if the desired data output signal is logic 1, the pull-up device 110 would be enabled by pre-driver 320, and pull-down device 120 would be disabled by pre-driver 330. Alternatively, for a data signal of logic 0, the pull-down device may be enabled by pre-drive 330, and the pull-up device would be disabled by pre-drive 320.

The pre-drivers have been described in this exemplary embodiment to buffer a received data signal to the output node. It is understood, however, that the scope of the present invention will encompass pre-drivers that may invert the output signal relative to the input signal.

In accordance with another embodiment, further referencing FIG. 3, a threshold detection and multiplexer circuit 310 may be operable to change a voltage of a supply 312 to pull-up pre-driver 320 based upon the voltage level of the output node 140. Assuming the buffer is to be in a tri-state mode (i.e., both the pull-up and pull-down MOSFETs to be disabled), an external stimulus to the I/O pad 140 may supply a voltage that could have the potential of influencing the integrated circuit of buffer 100.

For example, assume that the pull-up supply V3 coupled to the source of P-MOSFET 110 is 3.0 volts and the pull-up pre-driver 320 drives the gate of P-MOSFET 110 with 3.0 volts. With such signal levels, the gate-to-source voltage difference is 0 volts and P-MOSFET 110 disabled. Additionally, assume the gate of N-MOSFET 120 receives a 0 volt bias from the pull-down pre-amplifier 330. When the buffer is tri-stated, external communications, e.g., of a bus coupled thereto, may remain isolated from the integrated circuit of buffer 100. Ideally, when the buffer in a tri-state mode, it may keep the internal circuitry thereof isolated from the bus.

However, if an external bus carries a signal of voltage greater that the buffer's pull-up supply V3, then P-MOSFET 110 may risk enablement and coupling of the external I/O node to supply V3. For example, if a high level voltage (e.g., 5 volts) is presented at the output node 140, it may be effective to alter the relationships of the source and drain of P-MOSFET 110; wherein, the drain may now be viewed as the source (e.g., of a 5 volt level) and the source as the drain (e.g., of a 3 volt level). Accordingly, the voltage drop between node 140 and gate 112 may be 2 volts (as an effective gate-to-source voltage drop) and sufficient to turn-on the P-MOSFET 110 creating a low impedance undesirable conduction path between node 140 and V3.

In accordance with an exemplary embodiment of FIG. 3, detector and multiplexer 310 may sense the higher voltage level (e.g., 5 volts) of output node 140 and change supply 312 of pre-amp 320 so that it may drive gate 112 with a voltage (e.g., 5 volts) higher than V3. With the higher voltage gate bias, P-MOSFET 110 may remain turned-off to preserve the isolation of buffer 100' from the external bus while in its tri-state condition and when an overvoltage condition at node 140 exists.

Figure 4:
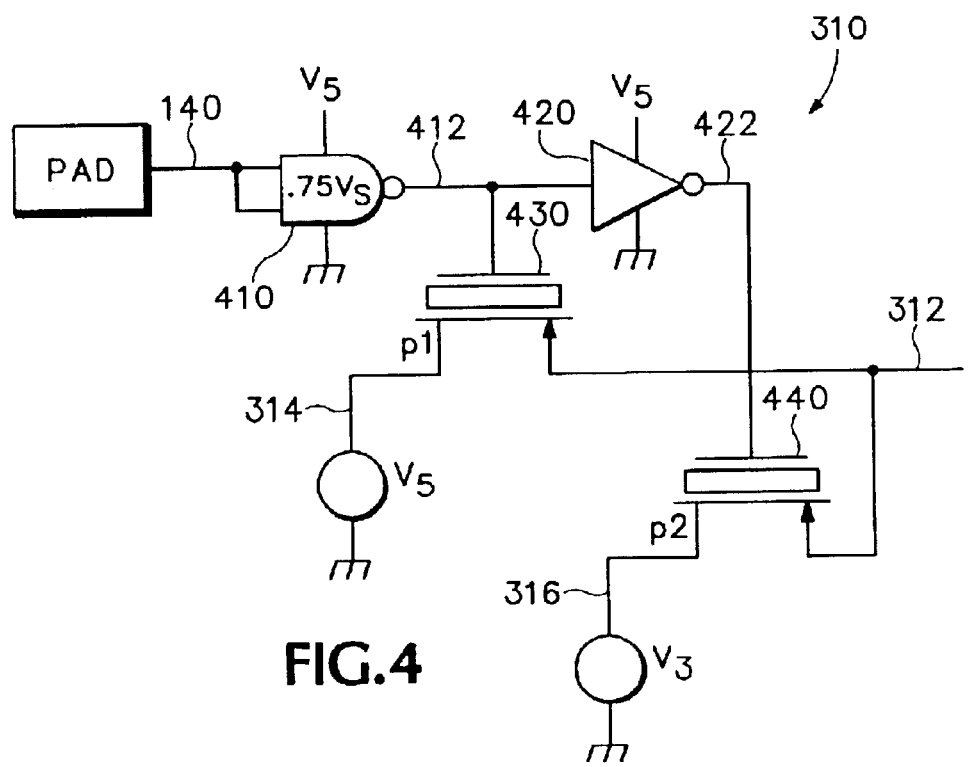
FIG. 4 is a schematic diagram of a voltage determining and multiplexer circuit.

Referencing FIG. 4, the over-voltage detector and multiplexer 310 may comprise NAND gate 410 coupled to receive the signal of I/O pad (output node) 140. NAND gate 410 drives the gate of PMOS 430, directly, and the gate of PMOS 440 via inverter 420. The drains of P-MOSFETs 430, 440 may be coupled to the two different supplies V3 and V5, respectively. NAND gate 410 may be configured to switch states when the voltage received from node 140 is greater/less than the voltage of V3 (i.e., which corresponds to the pull-up voltage of P-MOSFET 110 for the buffer's output driver). In a particular example, the threshold level is adjusted to about 75% of V5. Accordingly, when the voltage of output node 140 exceeds 0.75*V5, P-MOSFET 430 is enabled and P-MOSFET 440' disabled to supply node 312 to the pull-up pre-driver 320 (FIG. 3) with the higher voltage V5. Conversely, when the voltage of node 140 falls back to below 0.75*V5, line 312 receives the lower voltage of V3.

Accordingly, the over-voltage detection and multiplexer circuit 310' supplies either the V3 or V5 voltage to the pull-up pre-driver 320' depending on the overvoltage condition of the output. The pull-up pre-driver 320', in turn, may drive the gate of pull-up device 510 above V3 to gain a higher Idsat than that which might otherwise be available. The overdrive detection and operation that may be available from over-voltage detector and multiplexer 310' in combination with the pull-up pre-driver 320', may allow a relatively small MOSFET to be used for the pull-up device.

Figure 5:
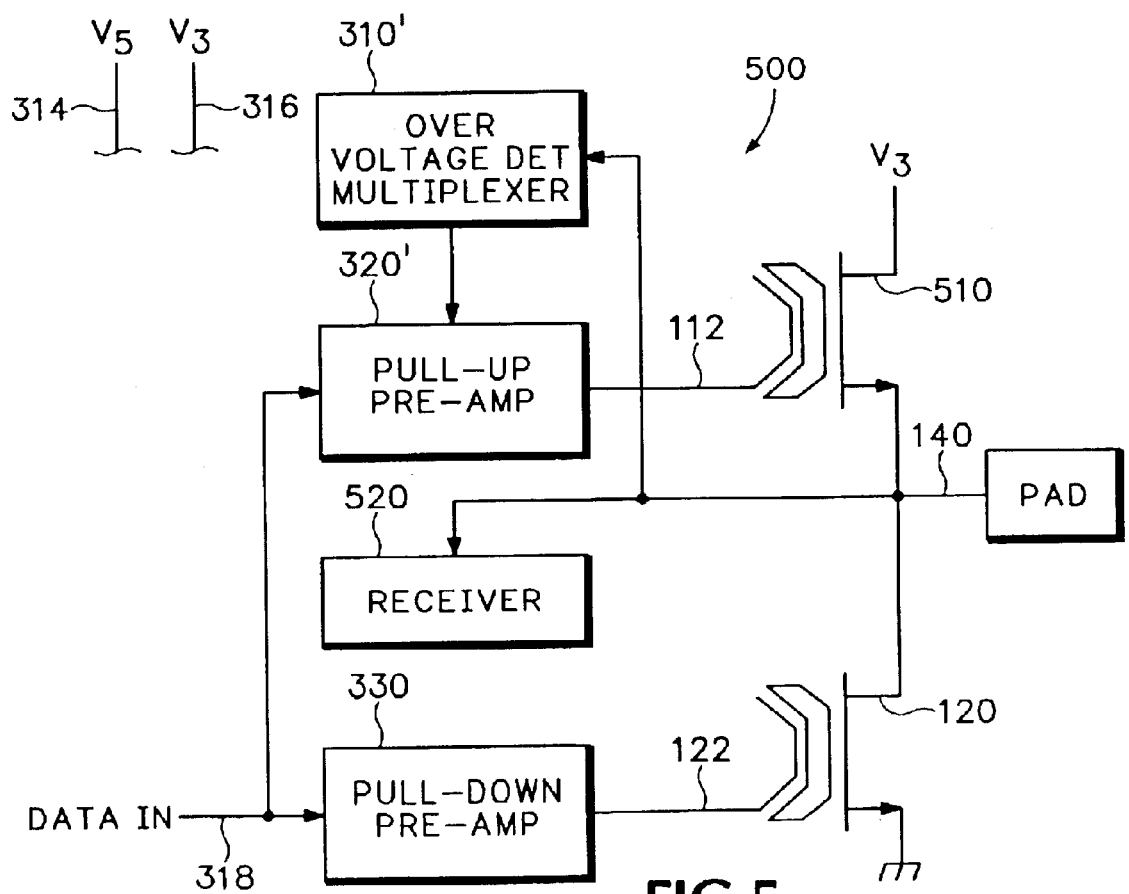
FIG. 5 is a schematic diagram representative of a buffer circuit, showing transistors to drive an output terminal and an over-voltage detector circuit to determine gate signals to a pull-up device dependent on levels at an output node.

In accordance with another embodiment, referencing FIG. 5, an I/O buffer 500 comprises to N-MOSFET devices 510,120 operable to drive output node 140 with high or low level signals. When driving output node 140, pre-drivers 320',330 drive gate nodes 112,122 of MOSFETs 510,120 respectively in accordance with the input data of input line 318. Pre-drivers provide the appropriate level shifting to enable/disable the driver MOSFETs appropately.

Referencing FIGS. 5 and 4, the over voltage detector and multiplexer circuit 310' may comprise the circuitry of FIG. 4, but with a slight difference. In this embodiment (FIG. 5) in which the pull-up device comprises an N-channel MOSFET 510, supplies 314,316 coupled to the circuit 310' may be reversed as presented to respective MOSFETs 430,440 in FIG. 4. Accordingly, when used for the buffer 500 of FIG. 5, the drain of P-MOSFET 430 (FIG. 4) may be coupled to receive the supply 316 of voltage V3 and the drain of P-MOSFET 440 coupled to receive the supply 314 of voltage V5.

Additionally, in this embodiment of FIG. 5, the pull-up and pull-down MOSFET's may each comprise vertical source and vertical drain MOS (VSDnMOS) devices. As used herein, the term "vertical" in this context may describe devices in which carriers of the device may travel directions different from the plane by which it traverses the FET channel. Or, the term "vertical" may refer to FET devices in which the direction of a portion of their carrier propagation may be perpendicular to a substrate surface. For example, shallow trench isolation may be formed in a source or drain region of a MOSFET. When carriers approach the trench, they may need to travel below the trench and may then return upwardly to the substrate surface before reaching the source/drain diffusion.

In the particular embodiment of FIG. 5, a VSDnMOS may be used for the pull-down by virtue of its lower Vt. The VSDnMOS may also enable an overdriving operation of its gate. It will be appreciated, in such embodiment, that a Tgox VDnMOS might also be substituted therefore.

Figure 6:
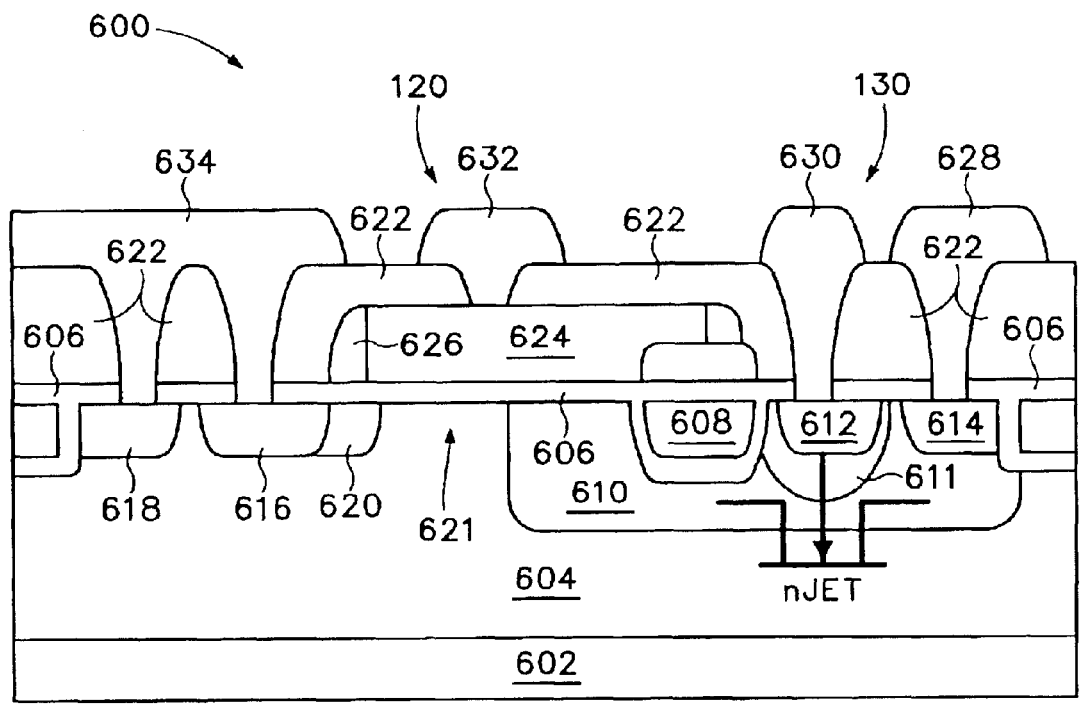
FIG. 6 is a simplified cross-sectional view of an integrated circuit showing a driver MOSFET and a JFET integrated together therewith.

In accordance with a further embodiment, referencing FIG. 6, an integrated circuit 600 may comprise an MOSFET 120 integrated within substrate 602/604. Additionally, JFET 130 may be integrated with the MOSFET within well 610 as may be assoicated with the drain region of MOSFET 120. The MOSFET and JFET, together, may form part a driver, for example, of an I/O buffer. In this embodiment, MOSFET 120 and JFET 130 may be formed as N-type devices. It will be understood, however, that although this embodiment may be described in the context of forming N-type MOS and JFET transistors, the dopant type of the substrate with respect to the doped regions might, alternatively, be reversed. Additionally, it will also be understood that both N-type and P-type devices might be formed on the same substrate for an integrated circuit.

Figure 7:
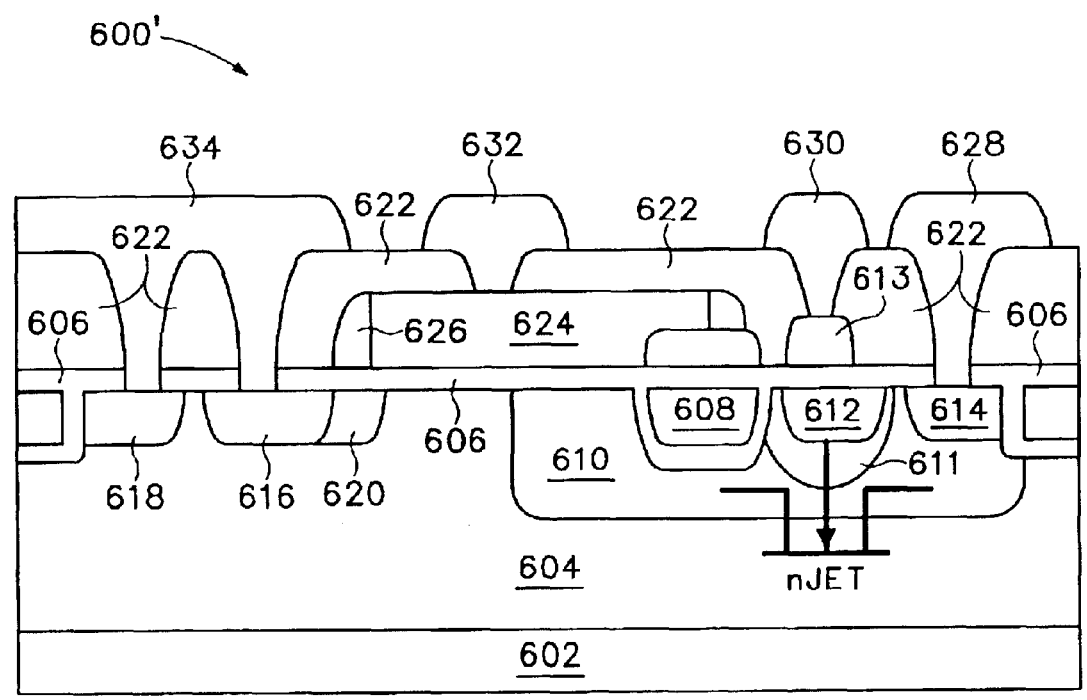
FIG. 7 is a simplified cross-sectional view of an integrated circuit showing a driver MOSFET and JFET integrated together therewith in accordance with an alternative embodiment.

In the embodiment illustrated in FIGS. 6 and 7, the N-well 610 for the MOSFET drain region includes trench 608, e.g., which may be filled with oxide. Because of trench 608, carriers travelling through MOSFET 120 may include an orientation of propagation other than horizontal. In otherwords, carriers of the MOSFET may traferse channel 621 beneath poly-gate 624, but when they reach oxide trench 608 of N-well 610, they may have to pass below the trench. Thereafter, to reach the drain contact 614 and metalization 628, the carriers may travel vertically toward the substrate surface. Accordingly, the MOSFET may be characterized as a vertical drain MOSFET—VDMOSFET.

With a vertical drain MOSFET, a relatively deep N-well is formed for the drain region to allow accomidation of trench 608. Already having a deep drain region, the formation of a JFET integrated therewith may be readily acheived. Adding a P+ gate region within the well 610 may complete the integration. As may be seen with reference to FIGS. 6 and 7, a dopant implant of first conductivity may be used to form gate region 612 of first conductivity type within well 610 of second conductivity type. For example, well 610 may be N-type conductivity and gate region 612 for the JFET gate formed for P-type conductivity.

In this embodiment, diffused region 612 forms the gate region of the JFET and may comprise a depth less than that of well 610 of the MOSFET drain. This leaves a region 611 of well 610 beneath the JFET gate operable to receive an electric field influence from the gate region 612 of JFET 130. Biasing of the JFET's gate region (or well 612) may then deplete carriers within the N-well 610. In other words, biasing of the JFET gate may pinch the depletion channel to have the effect of modulating a resistance in series with the MOSFET. In this embodiment, the depletion region may be influenced by the bias of the semiconductor body region 604 and the JFET's gate region 612. Additionally, the bias of the MOSFET's drain contact 614 may also affect the depth of the depletion region per the Vgs established for the JFET.

For one embodiment, referencing FIG. 6, a substrate may comprise a P-type semiconductor material, e.g., of first conductivity type epitaxial layer, over a supporting base 602. Next, a lightly doped N-well 610 may be formed in the layer of P-type semiconductor material. Highly doped N-type regions may then be implanted to form source and drain diffused areas 616 and 614 respectively. Source region 616 may be formed in space relationship form the drain region or well 610. The region between the source region 616 and drain region 610 may be referenced as a channel region 621 within the semiconductor material 604 beneath the silicon surface. The region may be operable to receive an electric field for enhancing carriers therein as part of an enhancement channel type MOSFET 120.

In this embodiment, a halo-implant region 620 may be formed near the source region 616 as dopant profile transition region to the channel region 621 of the MOSFET device 120. Implanted P-type region 618 in semiconductor material 604 provides a body contact. In this embodiment, the body contact and the source region may be connected together with source metal 634.

The additional implant of the P-type material to form region 612 (of first conductivity type) as the gate region to a JFET integrated within the drain region N-well 610 (of second conductivity type) to the MOSFET. The P-type material of diffusion 612 may be implanted neighboring the trench 608 as associated with the vertical drain MOSFET 120. It will be understood that the masking, patterning and implant processes available to formation of VDMOSFETs may be used to mask, pattern and implant for the formation of P-type well 612 as the gate region of JFET 130.

As shown pictorially, the implant energy for well 610 of second conductivity type may be understood to be greater than that to implant the first conductivity type dopants for well 612. Thus, the depletion region 611 may be left beneath the gate region 612 as integrated within the drain region of the MOSFET.

Oxide and oxide trench material may be formed as the MOSFET gate oxide layer 606 and trench fill 608 respectively. It may be understood that the fill 608 need not comprise oxide, but may comprise other insulating material compatible with the semiconductor material processes.

Polysilicon material 624 patterned over the gate oxide layer may establish the insulated gate structure of the MOSFET. The gate 624 may be operable under bias to apply an electric field to channel region 621 of the semiconductor material near the surface of the substrate and beneath the oxide. The electric field may establish and enhanced conductive channel between the source and drain regions 616 and 610.

Spacers may be formed beside the polysilicon gate 624 as may be utilized in the patterning and implant of the halo region 620 separately from the patterning of the source and drain contact implants 616. The spacers in this embodiment of FIG. 6 are shown along the side-walls of the gate 624.

Additional insulating material 622 (e.g., TEOS, Polyoxide, SOG, etc) may be formed over the substrate and patterned to establish windows to contact different portions of the integrated circuit. For example, a window may be formed throught the insulating layer 622 and/or the gate oxide layer 608 to allow contact to the substrate body region 618, source contact region 616, the MOSFET gate 624, the JFET gate 612 and the drain contact region 614. Metal may then be formed over the inslulating layer and in electrical contact with the different regions of the integrated circuit as defined by windows of the previously patterned insulating layer 622. Patterning of the metal may isolate the source metal 634 from the MOSFET gate metal 632, the JFET gate metal 630 and the drain metal 628.

In the DC implementation, referencing FIG. 6, JFET gate metal 630 may be formed to contact the JFET gate region 612 directly. In an alternative embodiment, referencing FIG. 7, the JFET gate 612 is capacitively coupled to polycrystalline silicon region 613 through the very thin insulating layer 606. Polysilicon region 613 is subsequently directly coupled to interconnect node 630. In this embodiment, the gate metal 630 may be capacitively coupled to the dopant implant 612 of the JFET's gate region. The gate region 612 might thus be capacitively pumped to receive biasing for modulating the depletion region 611 of the JFET's 130 channel.

In operation, referencing FIG. 6, a lateral current may flow horizontally from the n+ source region 616 through the MOSFET's enhancement channel 621, through n-well 610 and to the N+ region 614. This current may be modulated by the pinching operation of the JFET 130. The JFET gate region 612 may receive biasing to modulate the depletion region 611 below the nJFET's gate region 612.

For the DC coupled JFET embodiment of FIG. 6, discharging the JFET gate region 612, or biasing its potential negative relative to the source of the nJFET (the output node 628) may reverse bias the junction interface between the P-region 612 and the N-region 610. With a reverse bias of the P-to-N junction, a depletion layer may form and thereby restrict charge from moving horizontally in the n-well.

Referencing FIG. 3 for the DC-coupled embodiment, the negative bias might be generated on the die of the integrated circuit via charge pumping using conventional back-bias generation.

In an alternative embodiment, referencing FIG. 7, the gate region 612 of the JFET may be AC-coupled to its preamplifying circuit. Accordingly, should the integrated circuit (that may incorporate this embodiment of the buffer) enter a sleep or suspended activity mode, the series capacitor may limit and block current flow across the P-N junction region.

It will be apparent to those skilled in this art that the illustrated embodiments are exemplary and that various changes and modifications may be made thereto as become apparent upon reading the present disclosure. Accordingly, such changes and modifications are considered to fall within the scope of the appended claims.

What is claimed is:

1. A semiconductor device comprising:
   a substrate of a first conductivity type;
   first and second wells of second conductivity type in the substrate;

conductive material over a channel region of the substrate between the first and second wells;

the conductive material operable under bias to apply an electric field to the channel region of the substrate to enhance carriers therein between the first and second wells; and a third well of first conductivity type within the first well;

conductive material capacitively coupled to the third well; and the third well operable to receive a bias to apply an electric field to a depletion region of the first well and operable for depletion of carriers within the depletion region.

2. A semiconductor device according to claim 1, in which the depletion region is a contiguous portion of the first well proximate the third well.

3. A semiconductor device according to claim 1, further comprising dielectric between the substrate and the conductive material.

4. A semiconductor device according to claim 3, further comprising:

dielectric over the third well; and the conductive material capacitively coupled to the third well located over the dielectric;

the channel region of the substrate operable as an enhancement channel; and the conductive material capacitively coupled to the third well separate from the conductive material over the channel region of the substrate.

5. A semiconductor device according to claim 1, further comprising:

a drain contact to the first well;

the third well operable under the bias to adjust a series resistance of the first well between the drain contact and the enhancement channel region.

6. A semiconductor device according to claim 4, further comprising the conductive material capacitively coupled to the third well by direct contact.

* * * * *